United States Patent [19]

Myers et al.

[11] Patent Number: 4,862,014

[45] Date of Patent: Aug. 29, 1989

[54] METHOD AND APPARATUS FOR CONTROLLING THE PHASE OF SIGNAL DRIVING A FERRIMAGNETIC LOAD

[75] Inventors: Terrence L. Myers, Fullerton; William A. Harrington, Whittier, both of Calif.

[73] Assignee: Hughes Aircraft Company, Los Angeles, Calif.

[21] Appl. No.: 168,611

[22] Filed: Mar. 7, 1988

Related U.S. Application Data

[63] Continuation of Ser. No. 880,765, Jul. 1, 1986, abandoned.

[51] Int. Cl.⁴ .......................... H03K 3/01; H03B 3/04
[52] U.S. Cl. .................................... 307/270; 307/101; 307/412; 328/155; 342/372; 333/24.1
[58] Field of Search ....................... 307/270, 101, 412; 328/155; 342/368, 372; 333/24.1

[56] References Cited

U.S. PATENT DOCUMENTS

| | | | |
|---|---|---|---|
| 3,510,675 | 5/1970 | Johnson et al. | 307/101 |
| 3,521,079 | 7/1970 | Kuck | 307/88 |
| 3,626,425 | 12/1971 | Strenglein | 307/262 |
| 3,988,686 | 10/1976 | Beall et al. | 333/24.1 |
| 4,268,826 | 5/1981 | Baurle et al. | 342/368 |
| 4,469,961 | 9/1984 | Milberger et al. | 333/24.1 |

OTHER PUBLICATIONS

International Search Report, Application No. PCT/US 87/01591, Filing date Jul. 1, 1987.

*Primary Examiner*—Stanley D. Miller
*Assistant Examiner*—Richard Roseen
*Attorney, Agent, or Firm*—Thomas A. Runk; A. W. Karambelas

[57] ABSTRACT

A device-implemented method for driving a ferrimagnetic load (10), such as a phase shifter in an antenna array, which precisely meters the amount of magnetic flux imparted to the load (10) by sensing the voltage applied to a winding and integrating the sensed voltage over time. The time intergrated voltage is proportional to the magnetic flux imparted to the load (10) and is constantly compared to a preprogrammed value stored in a memory (18). When the sensed voltage reaches the preprogrammed value, the voltage is removed from the load (10) so that a metered amount of magnetic flux, proportional to the preprogrammed value, remains in the load (10). The load (10) is initially reset by delivering current in one direction through its winding until saturation is reached. The load (10) is set with a metered amount of magnetic flux by delivering current in the opposite direction through the winding. A current sensing circuit (68) senses the point at which the load (10) becomes saturated during the reset cycle and also senses current flow through the winding during the set cycle in order to prevent a current overload.

16 Claims, 2 Drawing Sheets

| FIG. 1 |
| FIG. 2 |

METHOD AND APPARATUS FOR CONTROLLING THE PHASE OF SIGNAL DRIVING A FERRIMAGNETIC LOAD

This application is a continuation of application Ser. No. 880,765, filed July 01, 1986 now abandoned.

BACKGROUND OF THE INVENTION

1. Field of the Invention

The present invention broadly relates to a device for changing the current flow through a ferrimagnetic load so as to affect the magnetic flux imparted to the load, and deals more particularly with a device-implemented method for driving a phase shifter for an antenna array in which the magnetic flux imparted to the phase shifter is precisely metered.

2. Description of Related Art

Phase shifters are used as primary components in electronically controlled array antennas. An array antenna contains many individual radiating elements. By properly controlling the phase of each element, the resulting beam of the antenna can be steered electronically. By using a so-called reciprocal phase shifter, the same antenna can be used as a receiving antenna with a steerable beam.

Ferrite phase shifters employed in array antennas are formed by placing ferrite materials in a section of a waveguide. The ferrite phase shifter can be either a reciprocal or non-reciprocal device depending upon its configuration. In a reciprocal phase shifter, phase shifting is accomplished by changing the magnetic permeability of the ferrite through changing the externally applied DC magnetic field. Non-reciprocal ferrite phase shifters provide a shift in microwave phase dependent upon the amount of remanent magnetism in the ferromagnetic element. A coil of wire, forming an inductive load, is normally used to alter the strength of the magnetic field in a reciprocal phase shifter. The strength of the field in a non-reciprocal phase shifter is a function of voltage across its toroidal winding versus the period of time that the voltage is applied.

In the past, the strength of the magnetic field was controlled by controlling the time period for which the voltage was applied to the coil. In order to accomplish this, the switching speeds of the control element were required to be extremely fast and it was also necessary that the applied voltage be controlled very precisely. U.S. Pat. Nos. 3,947,776 and 4,469,961, respectively issued Mar. 30, 1976 and Sept. 4, 1984, exemplify prior approaches for driving inductive loads, such as phase shifters, which rely on extremely fast switching times. Specifically, the arrangements in these prior patents relate to reciprocal-type phase shifters for establishing and then sustaining a current flow by reducing the drive voltage. These previous systems were less than completely satisfactory in terms of their speed and accuracy because of variables which affect the switching time, such as variations in rise time, voltage drops on the power supply and temperature variations.

The present invention is directed toward overcoming the above-mentioned deficiencies.

SUMMARY OF THE INVENTION

According to the present invention, a deviceimplemented method is provided for driving a ferrimagnetic load, such as a non-reciprocal ferrite phase shifter, in an antenna array be precisely metering the amount of magnetic flux imparted to the load. The voltage applied across its winding is sensed by a differential amplifier and is integrated over time by an integrating amplifier and capacitor. The time integrated voltage is proportional to the magnetic flux imparted to the load and is continuously compared to a preprogrammed value stored in a memory. When the time integrated voltage reaches the preprogrammed value, the voltage is removed from the winding so that a metered amount of magnetic flux, proportional to the preprogrammed value, remains in the load. The load is initially reset by delivering current in one direction through the winding until the load is saturated. A current sensing circuit determines when the load has become saturated and removes voltage from the winding when the saturation point is reached. The load is set by delivering current through the winding in the opposite direction. Current is driven through the winding by a pair of bridged drivers which include MOSFET's. The differential amplifier and integrating amplifier function in a manner which takes into consideration variations in voltage rise time, viltage drops on the power supplies and temperature variations.

BRIEF DESCRIPTION OF THE DRAWINGS

In the accompanying drawings:

FIGS. 1 and 2 are to be arranged for proper viewing.

DESCRIPTION OF THE PREFERRED EMBODIMENTS

Figures 1, 3:
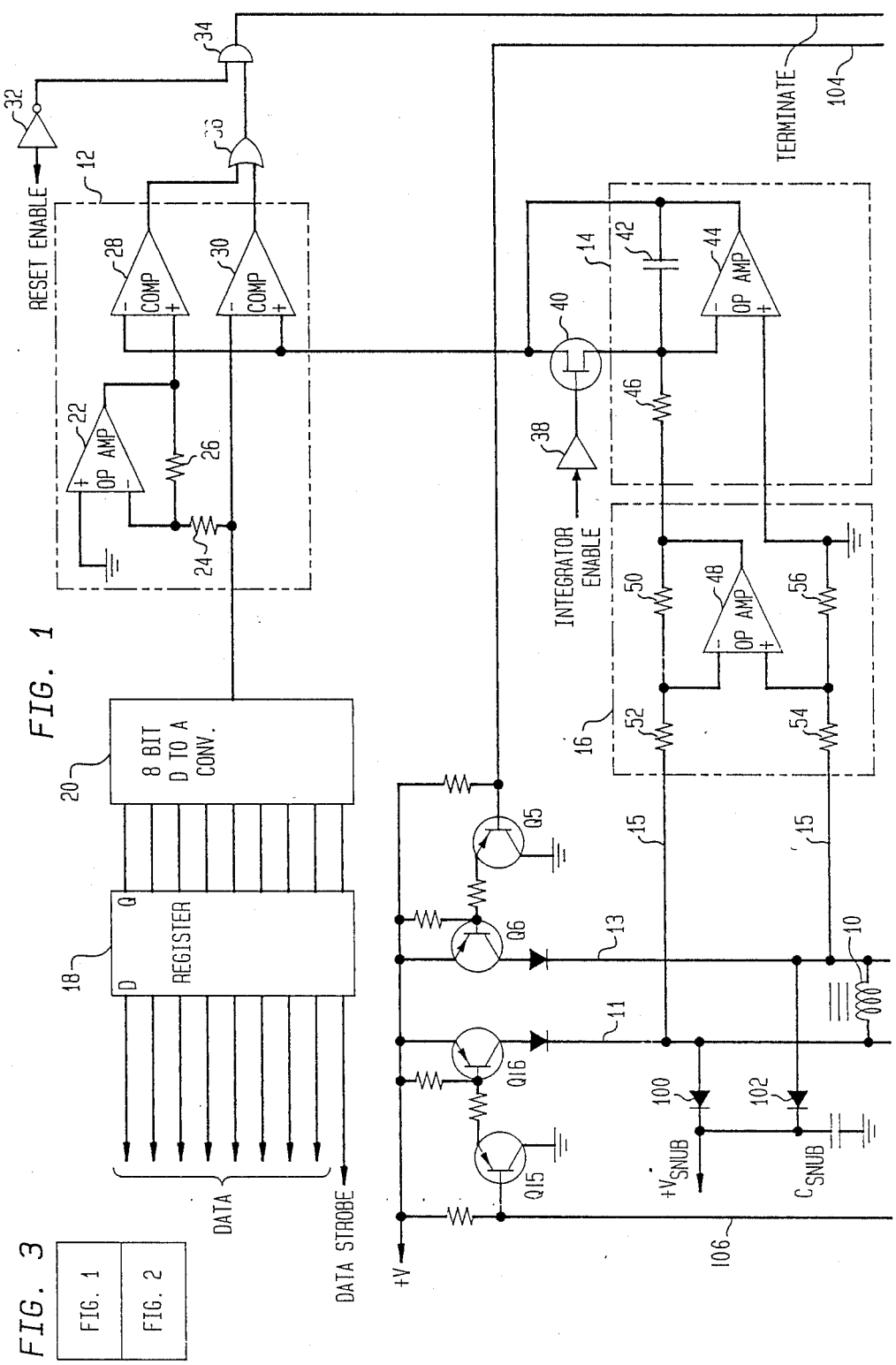
FIGS. 1 and 2, taken together, form a detailed schematic diagram of a circuit for driving a ferrimagnetic load, which forms the preferred embodiment of the present invention.
FIG. 3 is a plan view showing how
Figure 2:
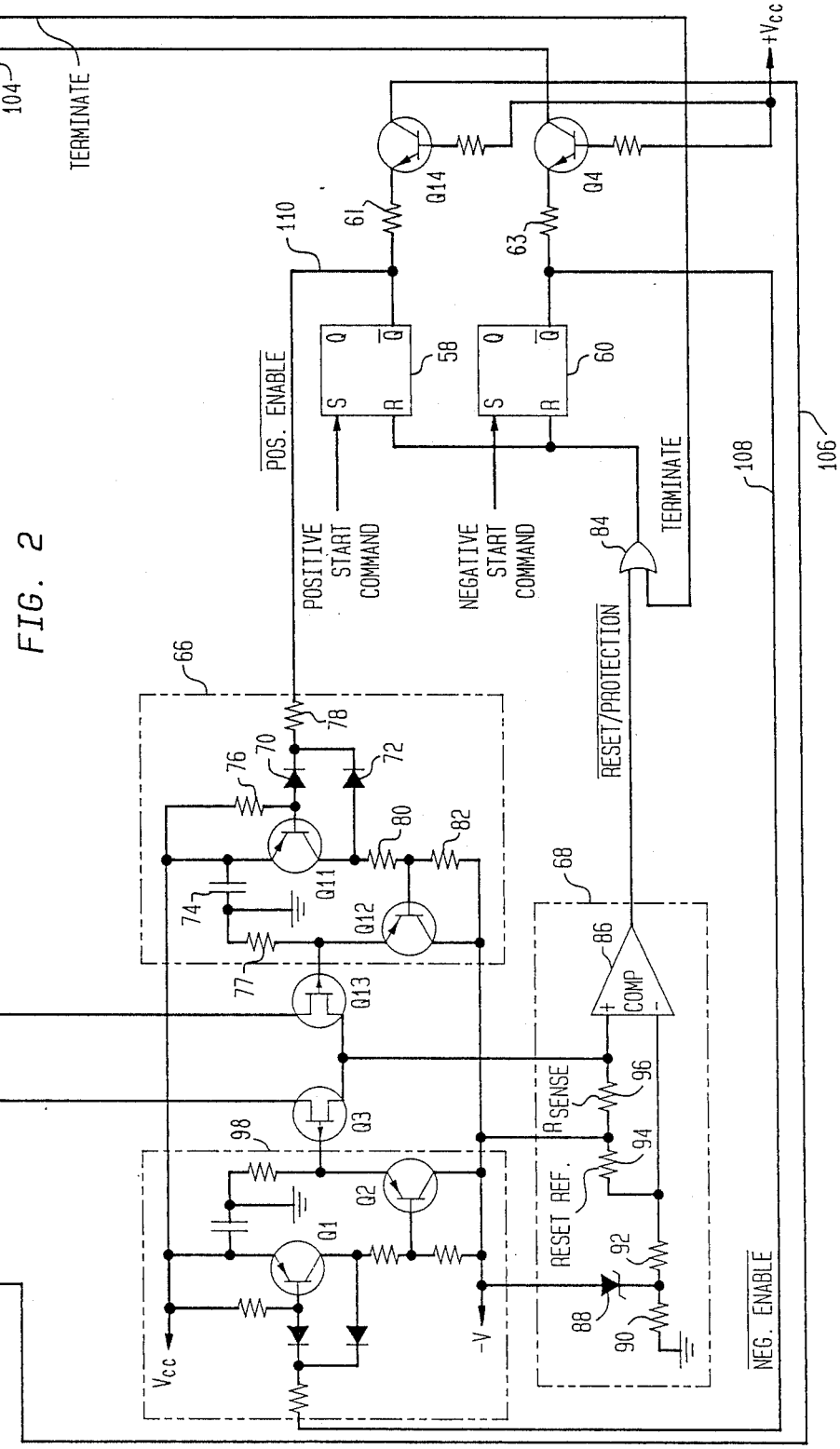

Referring to FIGS. 1 and 2, the present invention broadly relates to a device-implemented method for driving an inductive load and particularly a ferrimagnetic load, such as the coil 10 of a nonreciprocal type ferrite phase shifter. The phase shifter is used in an incorporating radar or communiations system, and more particularly an antenna array, comprising a plurality of individual radiating elements. The phase shift imparted to each radiating element is dependent upon the quantity of gauss contained in the magnetic field of the phase shifter. The strength of the field in the ferrite is a function of the voltage across the coil 10 and the period of time that this voltage is applied.

The coil 10 is coupled across a pair of lines 11, 13 and is "driven" by a pair of bridged drivers comprising transistors Q5, Q6, Q15 and Q16. These drivers are referred to as being "bridged" because the coil 10 is connected between the two sets of drivers, i.e. one side of coil 10 is connected via line 13 to delivers Q5, Q6 while the other side of the coil 10 is connected via line 11 to transistors Q15, Q16. These drivers respectively deliver current alternately through the coil 10 in opposite directions. Transistor Q5 has its base connected with a control line 104 and is operative to control the base electrode of transistor Q6. The collector-to-emitter path of the transistors Q6 and Q16 are connected between a positive source of voltage and the coil 10. Transistor Q15 has its base connected to a control line 106 and is operative to control the base electrode of transistor Q16.

Transistors Q15 and Q16 cooperate with a switching transistor Q3 and a Baker-clamped driver generally indicated within the broken line 98. The Baker-clamped driver 98 broadly includes a pair of transistors Q1 and Q2 which control the gate of transistor Q3, and is controlled by a negative enable signal received on line 108.

Similarly, transistors Q5 and Q6 operate in concert with a switching transistor Q13 and a Baker-clamped driver, generally indicated within the broken line 66. The Baker-clamped driver 66 includes a pair of transistors Q11, Q12 as well as resistors 76, 77, 78, 80 and 82, capacitors 74 and diodes 70, 72. The Baker clamp driver 66 is essentially identical in all respects to driver 98 and is controlled by a positive enable signal received on line 110. The driver 66 is connected to and controls the gate of transistor Q13. Transistors Q3 and Q13 are MOSFET's which by their nature have a particularly fast switching time. The source-to-drain path of each of the transistors Q3, Q13 are connected with each other and with a current sensing circuit 68 which functions to sense the magnitude of current flowing through the coil 10. The current sensing circuit 68 includes an operational amplifier 86, a zener diode 88 and resistors 92, 96. Resistor 90 completes the current path for diode 88. The op-amp 86 is configured as a comparator so as to compare the voltage on its non-inverting input, which is proportional to the flow of current through coil 10, with a reference voltage on its inverting input. The output of the comparator 86 is delivered through an OR gate 84 to the reset inputs of a pair of flip-flops 58,60. The set inputs of flip-flops 58 and 60 are connected with the incorporating communications system (not shown) which controls the antenna in its transmit and receive modes. The $\overline{Q}$ output of flip-flop 58 is delivered on line 110 as a positive enabling signal to the Baker clamp driver 66, and is also delivered through resistor 61 and through transistor Q14 as an enabling signal to the base of transistor Q15, on line 106. In a similar manner, the $\overline{Q}$ output of flip-flop 60 is delivered as a negative enabling signal on line 108 to the Baker-clamped driver 98, and is also delivered through resistor 63 and through transistor Q4 and line 104 to the base of transistor Q5.

Means generally indicated within the broken line 16 are provided for sensing the magnitude of voltage applied across the coil 10. The voltage sensing means 16 is connected across the coil 10 by means of lines 15. The voltage sensing means 16 comprises an op-amp 48 and resistors 50, 52, 54, 56. The output of the voltage sensor 16 is delivered to an integrator 14 which functions to integrate the sensed voltage over time. The integrator 14 comprises an operational amplifier 44, a resistor 46 and a capacitor 42 connected in feedback between the output of the op-amp 44 and its inverting input. The integrator 14 is controlled by a switch in the nature of a FET 40 which receives an enabling signal from the incorporating communications system through an amplifier 38.

The time integrated voltage value output by the integrator 14 is delivered to the inverting and non-inverting inputs respectively of a pair of comparators 28 and 30. Op-amp 22 and resistors 24, 26 invert the voltage applied to the non-inverting input of comparator 28. Comparators 28, 30, along with an op-amp 22 and resistors 24 and 26, form a "window comparator" which functions to compare or "threshold" the time integrated voltage value provided by the integrator 14 with a reference value when the coil 10 is being set either in a transmit or receive mode. This reference value is defined by a multibit digital data word which is received from a suitable source such as a memory (not shown). In the present example, the data word comprises eight bits which are loaded from the source (memory) into a register 18 upon receipt at the register 18 of a data strobe signal from the incorporating communication system. A D/A converter 20 converts the digital data to an analog signal which is delivered to the non-inverting and inverting inputs respectively of the comparators 28,30. In regard to the input to comparator 28, the voltage is inverted as discussed above. The outputs of the comparators 28,30 are delivered through an OR gate 36 to one input of an AND gate 34. The second input to the AND gate 34 is formed by a reset enable signal received from the incorporating communications system which is inverted by an inverter 32. The output of the AND gate 34 is delivered through the other input of OR gate 84 to the reset inputs of flip-flops 58,60.

Having generally described the components of the circuit, a more detailed description will now be given with reference to its operation. In connection with the present description, it will be assumed that the phase shifter of which the coil 10 forms a part is of the non-reciprocal type in which the phase shift applied to an incoming or received signal is different from that applied to an outgoing, transmitted signal. It is thus necessary to "set" the ferrite with the appropriate amount of magnetic flux very quickly between the transmit and receive cycles. The data word loaded into the register 18 is preprogrammed and may be, for example, non-linear. This data word corresponds to a voltage value to be integrated across the coil 10 during the transmit and receive cycles. This value may be the same for both the transmit and receive cycles but of opposite polarity. In other words, the value represented by this data word is proportional to the magnitude of magnetic flux imparted to the ferrite by the coil 10.

Initially, before a metered amount of flux is imparted to the ferrite from the coil 10, the coil 10 is reset by driving it into saturation. By driving the coil 10 into saturation, the initial value of the magnetic flux is known and this flux remains in the ferrite after the current is turned off. The reset cycle will be described later in more detail. Assume now that the ferrite has been reset and it is desired to set the ferrite in preparation for a transmit cycle. Digital data is delivered from a central bus of the incorporating communications system and is latched into the register 18. As mentioned above, the data word stored in register 18 corresponds to the voltage to be integrated across the coil 10 and is thus proportional to the amount of phase shift to be set in the ferrite. The D/A converter 20 converts the digital data to an analog, DC voltage signal which is delivered to the input of the window comparator 12. The op-amp 22 provides its complements to the comparators 28, 30 which form an absolute value peak detector. At this point, the integrator enabling signal from the incorporating communications system controls the FET switch 40 so as to discharge the capacitor 42 until the output of the integrator 14 is zero. A positive start command signal received at the set input of flip-flop 58 causes the $\overline{Q}$ output to drive the common base buffer transistor Q14 and the Baker-clamped driver 66. The enabling signal, delivered from transistor Q14 through line 106 to transistor Q15, turns on the latter. With transistor Q15 on, its emitter-follower drives the power transistor Q16 which forms one-half of the positive side of the bridge. The Baker-clamped driver 66 provides a voltage at the base of transistor Q12 which is sufficient to drive the power MOSFET Q13 which forms one part of the other side of the bridge. A circuit is thus completed which connects the coil 10 across the power supply, +V, −V, which can be traced as follows: from +V through transistor Q16, coil 10, MOSFET Q13 and transistor Q12 to −V. The voltages denoted by +V and −V are selected in accordance with switching time requirements of the application. +Vcc is a voltage appropriate to the logic devices employed.

The voltage sensor 16 outputs a voltage which is the absolute sum of the voltage on lines 11 and 13 referenced to ground. This absolute voltage is delivered to the integrator 14 which commences charging the capacitor 42. The integrator 14 supplies an output signal to the window comparator 12 which is a voltage/time product, i.e. the voltage applied across the coil 10 as a function of time. The comparator 12 compares the voltage time product supplied by the integrator 14 with the DC signal supplied by the D/A converter 20. When the voltage time product exceeds the value of the DC voltage signal supplied by the D/A converter 20, a signal is delivered through one of the comparators 28, 30 and OR gate 36 to one input of AND gate 34. At this point, the second input to AND gate 34 consisting of the reset enable signal is high, consequently a high signal is output from the AND gate 34 which functions to reset the flip-flop 58 through OR gate 84 connected by the line labled TERMINATE. The enabling signal output from the flip-flop 58 is removed, thereby turning off the bridge. During this turn-off phase, the positive side of the bridge turns off slowly but the output of the Baker-clamped driver 66 drops quickly. The emitter follower of transistor Q12 removes the stored charge on the gate of the MOSFET 13 causing teh latter to turn off quickly to leave a precisely metered amount of flux in the ferrite core of the phase shifter. Variables such as rise time, voltage variations in the power supply and temperature variations are taken into consideration by the voltage sensor 16 and the integrator 14. In the invention, the voltage across the coil 10 is not required to be constant over time as in prior techniques but an integration of voltage over time is used. Therefore, the amount of flux applied to the ferrimagnetic load by the coil is independent of the above-mentioned variations. The back EMF spike produced across the coil 10 is dissipated into a snubbing capacitor $C_{snub}$ via diodes 100, 102. The accumulated charge on $C_{snub}$ is removed by an external shunt regulator, $V_{snub}$.

During the reset mode, a high reset enable signal is inverted to a low signal by inverter 32, thereby disabling the output of AND gate 34. With AND gate 34 disabled, the window comparator 12 is likewise disabled, thus the flip-flops 58, 60 cannot be reset by the output of AND gate 34. In the reset mode, a start signal is delivered to the set input of one of the slip-flops 58, 60. For example, if a start signal is delivered to the set input of flip-flop 58, the positive side of the bridge will be turned on resulting in current flow in one direction through the coil 10. The current through the coil 10 increases until the voltage across resistor 96 ($R_{sense}$) exceeds a reset reference voltage on the inverting input of comparator 86. When this latter-mentioned reset reference voltage is exceeded, a signal is delivered from the output of comparator 86 through OR gate 84 to the reset input of flip-flop 58, the reset reference voltage on the inverting input of comparator 86 is such as to assure that the current through coil 10 during the reset cycle is sufficient to saturate the ferrite. This voltage is determined by resistors 92 and 94 which provide a voltage divider. It should be noted here that the current sensor 68 functions as a protective circuit to limit the magnitude of current flowing through the coil 10, even during the set cycle with the window comparator 12 enabled.

In order to set the ferrite in preparation for a receive mode, the start signal is delivered to the set input of flip-flop 60, rather than flip-flop 58. In response to a negative start signal, an output signal is delivered on line 108 to the Baker-clamped driver 98, and through the buffering transistor Q4 to the base of transistor Q5. Transistor Q5 drives transistor Q6 so that current flows from −V through transistors Q2, Q3, the coil 10 and transistor Q6 to +V.

Having thus described the invention, it is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A device for controlling the amount of magnetic energy imparted from a source of electrical power to a ferrimagnetic load in a ferrite phase shifter, comprising:
   means for applying electrical power from said source across said load;
   means for providing a reference potential;
   a difference amplifier means connected to both sides of said load for forming an absolute sum of the voltages on said sides referenced to the reference potential and for producing an output voltage signal proportional to the absolute sum;
   means for integrating said difference amplifier output voltage signal as a function of time and for producing a time integrated voltage signal;
   means for generating a reference signal proportional to a preselected amount of magnetic energy to be imparted to said load, said reference signal corresponding to a selected phase shift to be imparted by said phase shifter;
   means for comparing said time integrated voltage signal with said reference signal and producing an output signal when said integrated voltage signal equals said reference signal; and,
   means responsive to said comparing means for terminating the application of electrical power to said load in response to said output signal.

2. The device of claim 1, wherein said integrating means includes capacitive means for accumulating a charge proportional to the time that the difference amplifier output voltage signal is applied thereto and wherein said reference signal comprises an analog voltage.

3. The device of claim 1, wherein said generating means includes means for storing a multibit digital data word.

4. The device of claim 3 wherein said generating means includes means for converting said multibit digital data word into an analog signal.

5. The device of claim 1, wherein said comparing means includes a pair of differential amplifiers defining a window comparator.

6. A device for applying a metered quantity of magnetic flux to a phase shifting ferrimagnetic load of the type employed in an array antenna means including a plurality of phased elements for producing an antenna beam and for steering the antenna beam by controlling the phase of the elements of the array through magnetic flux density in the ferrimagnetic load, comprising:
- a difference amplifer for sensing the voltage difference across said ferrimagnetic load with respect to a preselected value and for producing an output voltage signal proportional to the sensed voltage difference;
- first means for integrating said output voltage signal over time, the integrated voltage signal being proportional to the quantity of magnetic flux imparted to said ferrimagnetic load;
- second means for comparing the integrated voltage signal with a reference value, said reference value corresponding to a selected phase shift to be imparted by said ferrimagnetic load; and,
- third means for applying electrical power to said ferrimagnetic load to change the magnetic flux of said ferrimagnetic load, said third means being operative to remove electrical power from said ferrimagnetic load when said integrated voltage signal reaches said reference value.

7. The device of claim 6, wherein said first means includes an operational amplifier having an input and an output, and capacitive means for storing electrical energy, said input being connected to receive said output voltage signal, said capacitor being connected between said input and said output.

8. The device of claim 7, including means for selectively discharging said capacitive means.

9. The device of claim 6, including means for storing said reference value as a multibit digital word and means for converting said multibit digital word to an analog signal.

10. The device of claim 9, wherein said third means includes:
- first and second circuits adapted to be coupled with a source of electrical power for respectively selectively coupling said ferrimagnetic load with said power source in opposite polarities such that current flows through said ferrimagnetic load in respective opposite directions;
- said second means having an output for delivering a disabling control signal when said output voltage signal is at least as great as said reference value;
- said first and second circuits each have an enabling input and a disabling input, the disabling inputs each being connected to the output of said second means for receiving said disabling control signal.

11. The device of claim 10, including means coupled between the disabling inputs of said first and second circuits and said ferrimagnetic load for sensing the magnitude of current flowing through said load and for delivering a disabling control signal to said disabling inputs when the sensed current exceeds a preselected value.

12. A device for controlling the amount of magnetic flux imparted to a non-reciprocal ferrite phase shifter adapted to be coupled with a source of electrical power and employed in an array antenna, said array antenna being of the type which produces first and second enabling signals for respectively conditioning the phase shifter for transmit and receive modes of operation, comprising:
- switch means for selectively coupling said phase shifter with said power source in either of two polarities such that current flows through said phase shifter in either of two opposite directions and responsive to a disabling signal for terminating the flow of current in one of said two opposite directions;
- means coupled with said phase shifter for forming an absolute value of the voltage applied to said phase shifter and for integrating said absolute value over time to produce an integrated voltage value; and
- means for comparing the integrated voltage value with an analog reference value and for producing said disabling signal and supplying it to said switch means when the integrated voltage value reaches said reference value.

13. The device of claim 12, wherein said switch means includes first and second bistable circuits having enabling inputs for respectively receiving said first and second control signals and disabling inputs for receiving said disabling signal.

14. The device of claim 13, including means coupled between said phase shifter and the disabling inputs of said first and second bistable circuits for sensing the magnitude of current flowing through said phase shifter and for delivering a disabling signal to the disabling inputs of said first and second bistable circuits when the sensed current exceeds a preselected value.

15. The device of claim 12, including means for storing a multibit digital data word representing said reference value and means coupled between said storing means and said comparing means for converting said data word into an analog signal defining said reference value.

16. A device for applying a metered quantity of magnetic flux to a phase shifting ferrimagnetic load of the type employed in an array antenna means including a plurality of phase elements for producing an antenna beam for steering the antenna beam by controlling the phase of the elements of the array through magnetic flux density in the ferrimagnetic load, comprising:
- first means for sensing the voltage applied across said ferrimagnetic load and for producing an output voltage signal proportional to the sensed voltage;
- an operational amplifier integrator having an input connected to receive said output voltage signal and an output providing an integrated signal;
- a register means for storing and presenting at an output a digital representation of the amount of phase shift to be imparted by said phase shifting ferrimagnetic load;
- converter means connected to the output of said register means for converting said digital representation to an analog reference value, said analog reference value corresponding to a selected phase shift to be imparted by said phase shifting ferrimagnetic load;
- an inverting amplifier having an output and an input connected to receive said analog reference value from said converter means;
- a first comparator amplifier having an output, a first input connected to the output of said operational amplifier integrator, and a second input connected to receive said analog reference value from said converter means;
- a second comparator amplifier having an output, a third input connected to the output of said operational amplifier integrator and a fourth input connected to the output of said inverting amplifier; and
- means receiving the output of each of said first and second comparators for removing electrical power from said ferrimagnetic load in response to a signal on either of said outputs of said first and second comparators.

* * * * *